(12) United States Patent
Mackey

(10) Patent No.: US 7,538,858 B2
(45) Date of Patent: May 26, 2009

(54) PHOTOLITHOGRAPHIC SYSTEMS AND METHODS FOR PRODUCING SUB-DIFFRACTION-LIMITED FEATURES

(75) Inventor: Jeffrey L. Mackey, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 488 days.

(21) Appl. No.: 11/329,755

(22) Filed: Jan. 11, 2006

(65) Prior Publication Data

US 2007/0159617 A1  Jul. 12, 2007

(51) Int. Cl.
G03B 27/02 (2006.01)
G03B 27/52 (2006.01)

(52) U.S. Cl. .......................... 355/78; 355/55
(58) Field of Classification Search ................ 355/80, 355/55, 78, 67; 264/482; 438/671; 250/492.1; 430/311, 269
See application file for complete search history.

(56) References Cited

U.S. PATENT DOCUMENTS

| | | | |
|---|---|---|---|
| 3,839,108 A | 10/1974 | Leinkram | |
| 4,234,362 A | 11/1980 | Riseman | |
| 4,419,809 A | 12/1983 | Riseman et al. | |
| 4,432,132 A | 2/1984 | Kinsbron et al. | |
| 4,502,914 A | 3/1985 | Trumpp et al. | |
| 4,508,579 A | 4/1985 | Goth et al. | |
| 4,648,937 A | 3/1987 | Ogura et al. | |
| 4,776,922 A | 10/1988 | Bhattascharyya et al. | |
| 4,838,991 A | 6/1989 | Cote et al. | |
| 5,328,810 A | 7/1994 | Lowrey et al. | |
| 5,330,879 A | 7/1994 | Dennison | |
| 5,424,549 A | 6/1995 | Feldman | |
| 5,514,885 A | 5/1996 | Myrick | |
| 6,004,862 A | 12/1999 | Kim et al. | |
| 6,010,946 A | 1/2000 | Hisamune et al. | |

(Continued)

FOREIGN PATENT DOCUMENTS

EP    0227303    7/1987

(Continued)

OTHER PUBLICATIONS

Bergeron, et al., "Resolution Enhancement Techniques for the 90nm Technology Node and Beyond," Future Fab International, Issue 15, Jul. 11, 2003, 4 pages.

(Continued)

*Primary Examiner*—Peter B Kim
(74) *Attorney, Agent, or Firm*—Knobbe Martens Olson & Bear LLP

(57) ABSTRACT

Systems and methods for near-field photolithography utilize surface plasmon resonances to enable imaging of pattern features that exceed the diffraction limit. An example near-field photolithography system includes a plasmon superlens template including a plurality of opaque features to be imaged onto photosensitive material and a metal plasmon superlens. The opaque features and the metal superlens are separated by a polymer spacer layer. Light propagates through the superlens template to form an image of the opaque features on the other side of the superlens. An intermediary layer including solid or liquid material is interposed between the superlens and a photoresist-coated semiconductor wafer to reduce damage resulting from contact between the superlens template and the photoresist-coated semiconductor wafer.

36 Claims, 5 Drawing Sheets

U.S. PATENT DOCUMENTS

| | | | |
|---|---|---|---|
| 6,042,998 | A | 3/2000 | Brueck et al. |
| 6,063,688 | A | 5/2000 | Doyle et al. |
| 6,071,789 | A | 6/2000 | Yang et al. |
| 6,211,044 | B1 | 4/2001 | Xiang et al. |
| 6,291,334 | B1 | 9/2001 | Somekh |
| 6,297,554 | B1 | 10/2001 | Lin |
| 6,348,380 | B1 | 2/2002 | Weimer et al. |
| 6,362,057 | B1 | 3/2002 | Taylor, Jr. et al. |
| 6,383,907 | B1 | 5/2002 | Hasegawa et al. |
| 6,423,474 | B1 | 7/2002 | Holscher |
| 6,455,372 | B1 | 9/2002 | Weimer |
| 6,473,237 | B2 | 10/2002 | Mei |
| 6,522,584 | B1 | 2/2003 | Chen et al. |
| 6,539,156 | B1 | 3/2003 | Dickson et al. |
| 6,548,396 | B2 | 4/2003 | Naik et al. |
| 6,573,030 | B1 | 6/2003 | Fairbairn et al. |
| 6,602,779 | B1 | 8/2003 | Li et al. |
| 6,632,741 | B1 | 10/2003 | Clevenger et al. |
| 6,689,695 | B1 | 2/2004 | Lui et al. |
| 6,706,571 | B1 | 3/2004 | Yu et al. |
| 6,709,807 | B2 | 3/2004 | Hallock et al. |
| 6,734,107 | B2 | 5/2004 | Lai et al. |
| 6,744,094 | B2 | 6/2004 | Forbes |
| 6,834,027 | B1 | 12/2004 | Sakaguchi et al. |
| 6,862,396 | B2 | 3/2005 | Dickson et al. |
| 6,893,972 | B2 | 5/2005 | Rottstegge et al. |
| 6,998,219 | B2 | 2/2006 | Fries |
| 7,318,907 | B2 | 1/2008 | Stark et al. |
| 2002/0042198 | A1 | 4/2002 | Bjarnason et al. |
| 2002/0063110 | A1 | 5/2002 | Cantell et al. |
| 2003/0044722 | A1 | 3/2003 | Hsu et al. |
| 2003/0119307 | A1 | 6/2003 | Bekiaris et al. |
| 2003/0127426 | A1 | 7/2003 | Chang et al. |
| 2003/0157436 | A1 | 8/2003 | Manger et al. |
| 2003/0207207 | A1 | 11/2003 | Li |
| 2003/0207584 | A1 | 11/2003 | Sivakumar et al. |
| 2003/0230234 | A1 | 12/2003 | Nam et al. |
| 2004/0000534 | A1 | 1/2004 | Lipinski |
| 2004/0018738 | A1 | 1/2004 | Liu |
| 2004/0023502 | A1 | 2/2004 | Tzou et al. |
| 2004/0027675 | A1 | 2/2004 | Wu et al. |
| 2004/0106257 | A1 | 6/2004 | Okamura et al. |
| 2004/0135100 | A1 | 7/2004 | Menon et al. |
| 2004/0152323 | A1 | 8/2004 | Suzuki et al. |
| 2004/0190116 | A1 | 9/2004 | Lezec et al. |
| 2005/0084912 | A1 | 4/2005 | Poponin |
| 2005/0088722 | A1 | 4/2005 | Quate et al. |
| 2006/0046200 | A1 | 3/2006 | Abatchev et al. |
| 2006/0046201 | A1 | 3/2006 | Sandhu et al. |
| 2006/0046422 | A1 | 3/2006 | Tran et al. |
| 2006/0046484 | A1 | 3/2006 | Abatchev et al. |
| 2007/0069429 | A1* | 3/2007 | Albrecht et al. ............ 264/482 |

FOREIGN PATENT DOCUMENTS

| | | |
|---|---|---|
| EP | 0491408 | 6/1992 |
| EP | 1357433 | 10/2003 |
| JP | 05343370 | 12/1993 |
| JP | H8-55908 | 2/1996 |
| JP | H8-55920 | 2/1996 |
| WO | WO 02/099864 A1 | 12/2002 |
| WO | WO 2004/001799 A2 | 12/2003 |
| WO | WO 2005/071491 A | 8/2005 |
| WO | WO 2006/026699 | 3/2006 |

OTHER PUBLICATIONS

Bethe, "Theory of Diffraction by Small Holes," The Physical Review, Second Series, vol. 66, Nos. 7 and 8, Oct. 1944, 163-182.

Bhave et al., "Developer-soluble Gap fill materials for patterning metal trenches in Via-first Dual Damascene process," preprint of Proceedings of SPIE: Advances in Resist Technology and Processing XXI, vol. 5376, 2004, 8 pages.

Chung et al., "Pattern mutiplication method and the uniformity of nanoscale multiple lines," J.Vac.Sci.Technol. B21(4), Jul./Aug. 2003, pp. 1491-1495.

Chung et al., "Nanoscale Multi-Line Patterning Using Sidewall Structure," Journal of Applied Physics, vol. 41, 2002, Pt. 1, No. 6B, pp. 4410-4414, Japan.

Durant et al., "Comment on Submicron imaging with a planar silver lens," Applied Physics Letters 86, 126101, 2005.

Fang et al., "Sub-Diffraction-Limited Optical Imaging with a Silver Superlens," Science, vol. 308, Apr. 2005, pp. 534-537.

Joubert et al., "Nanometer scale linewidth control during etching of polysilicon gates in high-density plasmas," Microelectronic Engineering 69, 2003, pp. 350-357.

Lezec et al., "Beaming Light from a Subwavelength Aperture," Science, Aug. 2002, pp. 820-822.

Oehrlein et al., "Pattern transfer into low dielectric materials by high-density plasma etching," Solid State Tech., May 2000, 8 pages.

Smolyaninov, "Far-field optical microscope with nanometer-scale resolution based on in-plane surface plasmon imaging," Journal of Optics, Feb. 2005.

PCT International Search Report and Written Opinion, dated Jul. 18, 2007 regarding PCT Application No. PCT/US2007/000299.

Richard J. Blaikie, et al: "Imaging through planar silver lenses in the optical near field" Journal of Optics. A, Pure and Applied Optics, Institute of Physics Publishing, Bristol, GB, vol. 7, No. 2, Feb. 1, 2005, pp. S176-S183.

S. A. Ramakrishina, et al: "Removal of absorption and increase in resolution in a near-field lens via optical gain" Physical Review B. Condensed Matter, American Institute of Physic, New York, US, vol. 67, No. 20, May 15, 2003, pp. 201101-1-201101-4.

I. I. Smolyaninov, et al.: "Experimental Study of Surface-plasmon Scattering by Individual Surface Defects," Physical Review B, Jul. 15, 1997, vol. 56, No. 3, pp. 1601-1611.

D. O. S. Melville, et al: "Super-resolution imaging through a planar silver layer" Optics Express, Optical Society of America, Washington, DC,, US, vol. 13, No. 6, Mar. 12, 2005 pp. 2127-2133.

* cited by examiner

PHOTOLITHOGRAPHIC SYSTEMS AND METHODS FOR PRODUCING SUB-DIFFRACTION-LIMITED FEATURES

BACKGROUND

1. Field of the Invention

The present teachings relate to photolithography systems and methods such as for use in fabricating semiconductor devices.

2. Description of the Related Art

Conventional "far-field" photolithography systems use light and a lens system to image a reticle having a pattern thereon onto a layer of photosensitive material deposited on a semiconductor wafer. Such conventional photolithography systems are referred to as "far-field" systems because the image produced is in the far field. Accordingly, the size of features in the reticle pattern that may be reproduced on the layer of photosensitive material is limited by far-field diffraction. The minimum feature size W that may be produced using a conventional far-field photolithographic system is $$W = k_1 \frac{\lambda}{NA} \quad (1)$$

where NA is the numerical aperture of the system, $\lambda$ is the wavelength of light used by the photolithography system, and $k_1$ is the resolution factor, which depends on other aspects of the system including, for example, the aberrations introduced by the specific photolithography system and the properties of the photosensitive material. According to this equation, to produce smaller features, the photolithographic system must utilize smaller resolution factor, a larger numerical aperture, a smaller operating wavelength, or a combination thereof.

Current far-field lithographic systems include complex lens that are well-corrected for aberrations. Accordingly, current far-field lithographic techniques have decreased the resolution factor to $k_1 \approx 0.3$, which is slightly greater than the theoretical lower limit of 0.25 for half-pitch imaging. These complex lens, however, may include many optical elements and are expensive.

The numerical aperture has also been increased. However, in systems where light propagates through air from the lens system to the semiconductor wafer having photosensitive material thereon, the numerical aperture is limited to one. Immersion lithography wherein the light propagates through a medium having an index of refraction greater than one has lead to increases in NA. Immersion techniques, however, suffer from problems such as incompatibility of the fluid and the wafer, bubble formation, and polarization effects. Further increases in NA are limited, however, because of the limited range of compatible immersion fluids having refractive indexes above one.

Smaller features may also be produced by using light sources having shorter operating wavelengths. Commercial photolithography systems may use visible light having wavelengths in the range of 350 nm-800 nm. Ultraviolet photolithographic systems operating with wavelengths in the range of 100 nm-350 nm may be used to print smaller features. Ultraviolet systems, however, also suffer from drawbacks such as increased cost, shorter lamp lifetimes, and lower efficiency. Furthermore, photoresist that is sensitive to visible light is cheaper and more robust with respect to airborne contaminants than ultraviolet-sensitive photoresist.

Thus, what is needed are photolithography systems that are not restricted to the diffraction limit of far-field optical systems and need not rely on use of complex and expensive lenses, immersion techniques, or the use of ultraviolet wavelengths.

SUMMARY

A variety of different embodiments of the invention are disclosed herein. Some of these embodiments comprise photolithographic systems comprising near-field optical systems.

One embodiment, for example, comprises a photolithographic system for exposing a photosensitive material having a first index of refraction and responsive to light having a wavelength, $\lambda$. The system comprises a plurality of features that are opaque to the light, a dielectric material disposed forward of the plurality of opaque features, a superlens disposed forward of the dielectric material and rearward of the photosensitive material, and an intermediary layer between the superlens and the photosensitive material. The dielectric material is substantially transmissive to the light. The intermediary layer comprises material substantially transmissive to the light with the material being different than the photosensitive material.

Another embodiment comprises a photolithographic system for producing a near-field image. The system comprises a substrate that is substantially transmissive to light, the light having a wavelength $\lambda$. The system further comprises one or more features disposed on the substrate, the features being substantially opaque to the light, a spacer material disposed on the substrate, the spacer material being substantially transmissive to the light, and a superlens formed on the spacer material. The spacer material has a first complex permittivity with a real part that is positive, and the superlens comprises material having a second permittivity with a real part that is negative. The system further comprises a layer of photosensitive material that is in proximity to the superlens and an intermediary layer that is interposed between the superlens and the layer of photosensitive material such that the superlens is separated from the photosensitive material. The layer of photosensitive material has a first index of refraction, and the intermediary layer has a second index of refraction substantially equal to the first index of refraction. The system produces a near-field image of the features in the layer of photosensitive material.

Another embodiment is a method of fabricating an integrated circuit device on a semiconductor wafer. The method comprises depositing a material to be patterned over the semiconductor wafer. A photosensitive layer is deposited on the material to be patterned. A superlens template is disposed in an optical path between a light source and the photosensitive layer. The photosensitive layer has a first index of refraction and is responsive to light having a wavelength, $\lambda$. The superlens template comprises a plurality of features substantially opaque to the light, a dielectric material disposed forward of the plurality of opaque features, and a superlens disposed forward of the dielectric material and rearward of the photosensitive layer. The dielectric material is substantially transmissive to the light. The photosensitive layer has a first index of refraction and is responsive to light having a wavelength, $\lambda$. The method further comprises interposing an intermediary layer between the superlens and the photosensitive layer to reduce contact of the superlens with the photosensitive layer. The intermediary layer comprises material substantially transmissive to the light. The light is directed into the superlens template thereby exposing portions of the photosensitive layer to the light.

Another embodiment comprises a photolithographic system for exposing a photosensitive material to a light beam. The system comprises means for blocking portions of the light beam to form a pattern of light and means for generating plasmons with the pattern of light. The system further comprises means for coupling the pattern of light into the plasmon generating means and means for protecting the photosensitive material from contact with the plasmon generating means. The coupling means are substantially transmissive to the light beam, and the protecting means are disposed such that light couples out of the plasmons into the protecting means.

An additional embodiment comprises a method of exposing a photosensitive material to a light beam. The method comprises blocking portions of the light beam to form a pattern of light, propagating the pattern of light, and generating plasmons with the pattern of light. The method further comprises coupling light out of the plasmons into a medium substantially optically transmissive to the light coupled out of the plasmons and protecting the photosensitive material from contact using the medium.

DETAILED DESCRIPTION OF CERTAIN PREFERRED EMBODIMENTS

Figure 1:
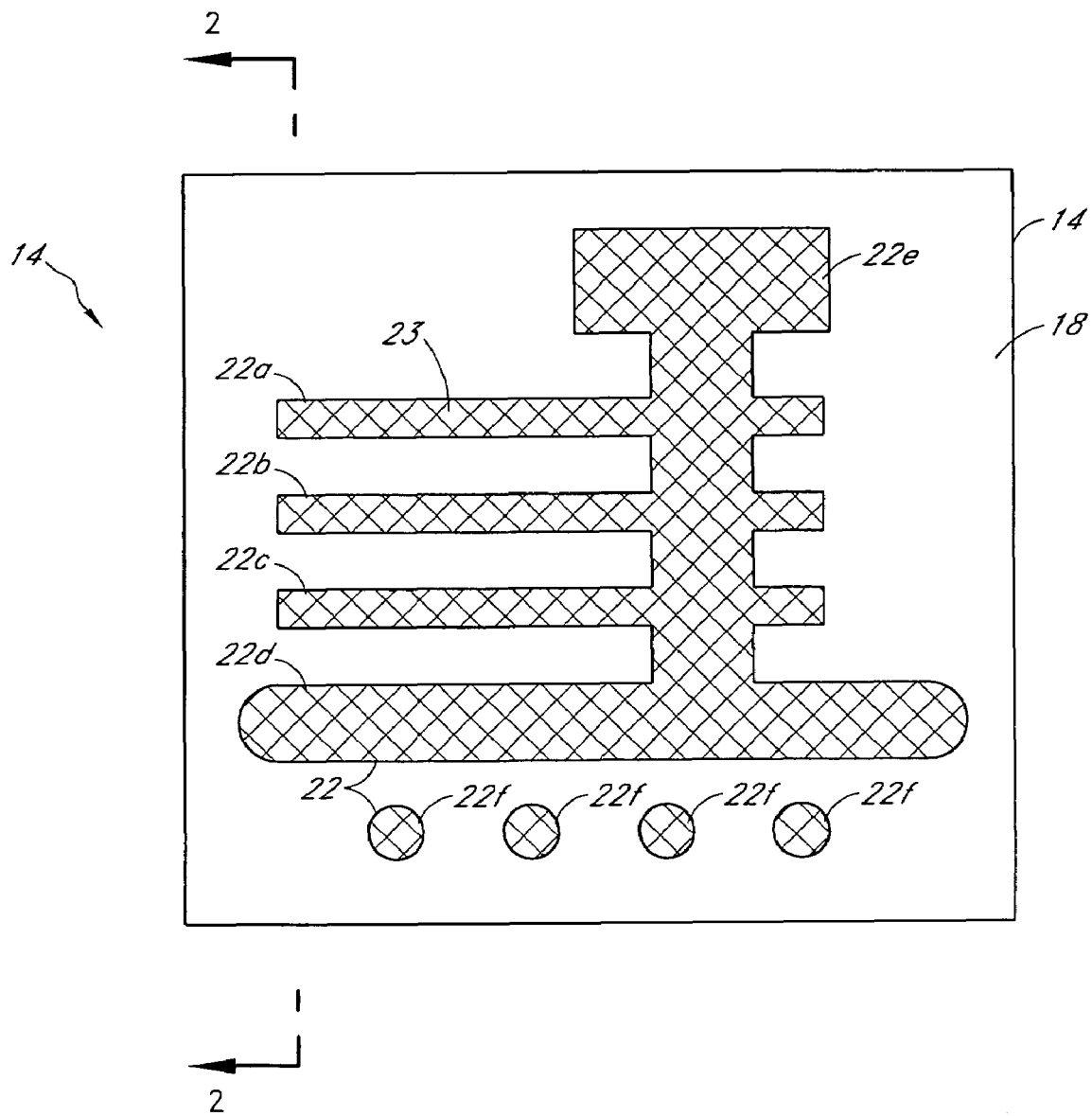
FIG. 1 is a top view of a superlens template for an embodiment of a near-field photolithography system wherein the superlens template comprises opaque features (shown) and a metal superlens layer (not shown).

Various embodiments of the invention comprise photolithography systems that use a superlens template 14, a top view of which is shown schematically in FIG. 1. This superlens template 14 comprises a substrate 18 and a pattern 23 comprising one or more features 22 to be imaged by the photolithography system.

Images of the pattern 23 may be produced by propagating light through the superlens template 14. In certain embodiments, for example, the light may be incident on an upper surface of the template 14. The light may have an operating wavelength $\lambda$. This wavelength may correspond to a central wavelength of a wavelength band. This wavelength band may be a narrow band having a bandwidth (FWHM) of one nanometer or less or may include one or more nanometers. Suitable operating wavelengths may be in the ultraviolet and visible range of the electromagnetic spectrum from about 100 nm-800 nm, and may include, for example, the I-line of mercury lamps ($\lambda$=365 nm), krypton-fluoride excimer lasers ($\lambda$=248 nm), or argon-fluoride excimer lasers ($\lambda$=193 nm). Use of visible wavelength offers several advantages such as described above. However, other operating wavelengths of light may be used, including extreme ultraviolet and infrared wavelengths.

Accordingly, in various embodiments, the substrate 18 is substantially transmissive to light of the operating wavelength and may comprise materials such as glass or quartz. Other materials that are substantially transmissive to light of the operating wavelength may be used. The material comprising the substrate 18 may have a substantially flat surface produced by, for example, polishing or planarization techniques, although the surface may be other than flat.

Conversely, the features 22 may comprise material that is substantially opaque to the operating wavelength. Other characteristics of the material comprising the features 22 may include a low skin depth such that light is quickly absorbed into the material. The features 22 need not be extremely thick to attenuate the light transmitted through the substrate 23. Additionally, the material may resonate at frequencies far from the plasmonic resonances of metals in the system. The material comprising the features 22 may also be able to wet and adhere to the substrate 18. Suitable materials include, for example, chromium, tungsten, titanium, titanium silicide, titanium nitride, silicon nitride, or their alloys or composites. In certain preferred embodiments, chromium is used. The thickness of the features 22 may range from 1 nm to 100 nm and may, for example, be about 50 nm. Other materials and other thicknesses, however, may be used.

The features 22 may be produced by depositing a layer of suitable material that may be etched to produce the pattern 23. In one embodiment, wafer processing techniques using conventional photolithography are used to pattern the features 22. For example, material that is to comprise the pattern 23 is deposited on the substrate 18. Photoresist is spun on, and the template 14 is exposed using a reticle or mask configured to produce the pattern 23 comprising the desired features 22. The photoresist is developed and etched to the substrate 18, leaving the features 22 adhered to the substrate 18. This embodiment may be suitable to print features 22 having pitches and sizes within the capabilities of conventional photolithographic systems that expose photosensitive material such as photoresist to pattern.

In another embodiment, features 22 that have pitches and sizes beyond the capability of such conventional photoresist-based photolithographic systems may be produced, for example, by charged particle beam lithography. For example, some embodiments may utilize focused ion beam (FIB) etching or electron beam lithography (EBL). Charged particle beam lithography advantageously may be used for limited-volume production of templates 14, especially those with small-scale features 22. In one embodiment, FIB lithography may be used to produce a pattern 23 comprising an array of 60 nm wide nanowires on a 120 nm pitch. In another embodiment, FIB lithography may be used to produce features 22 having a width in the range from 10 nm to 80 nm and preferably about 40 nm. Features outside these ranges may also be produced.

FIG. 1 depicts one embodiment of the pattern 23. The pattern 23 is intended as a sample and is not intended to limit the scope of the patterns or features that may be printed by the near-field photolithography system 10. The pattern 23 comprises four substantially parallel and substantially rectangular lines 22a-22d that are intersected by one substantially rectangular line that ends in a T-shaped region 22e. The number of lines selected to be illustrated in the pattern 23 in FIG. 1 is by way of example only and is not intended to limit the scope of the patterns 23 in the photolithography system 10. The spacing of lines 22a-22d is substantially uniform, and the width of line 22d is greater than the width of lines 22a-22c. The pattern illustrated in FIG. 1 also includes four substantially circular dots 22f. Patterns 23 with shapes and configurations other than the one depicted in FIG. 1 may be disposed on the substrate 18. Additionally, patterns 23 comprising greater or lesser numbers of features 22 and different sizes and spacings than shown in FIG. 1 may be printed.

Figure 2:
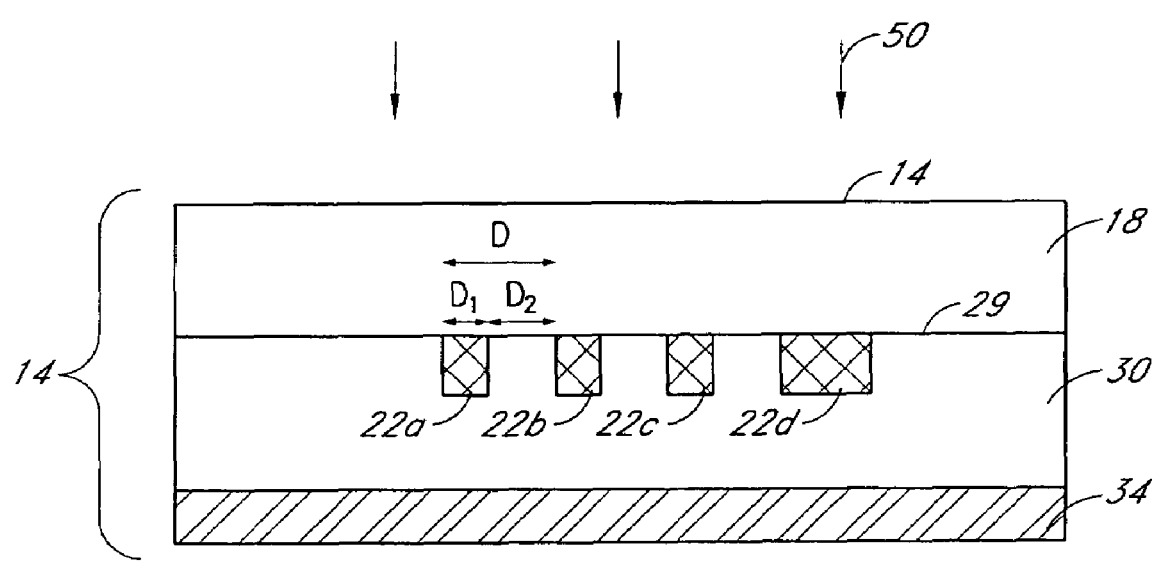
FIG. 2 is a cross-sectional view of an embodiment of the superlens template taken through the line 2-2 in FIG. 1 that shows both opaque features and the metal superlens layer.

FIG. 2 is a cross-sectional view along line 2-2 in FIG. 1 that further schematically illustrates aspects of the superlens template 14. Light, indicated by arrows 50, is incident on the template 14 and is substantially transmitted through the substrate 18. The light follows an optical path defined by the system 10. In the embodiment shown in FIG. 2, light is shown as being directed along a straight line that is substantially perpendicular to the superlens template 14, although the light may be incident on the superlens template at other angles in other embodiments. The terms "forward" and "rearward" used herein are made with respect to this propagation direction of the light along the optical path through the superlens template 14 to the target (e.g., photoresist on a semiconductor wafer). For example, a first element may be said to be forward (rearward) of a second element if the first and second elements are disposed such that light propagates through the second element before (after) it propagates through the first element.

The superlens template 14 may comprise in addition to the substrate 18 and the features 22, a spacer layer 30 and a superlens 34. The superlens 34 may be forward of the spacer layer 30, which may be forward of the features 22. FIG. 2 shows sample features 22a-22d formed on a surface 29 of the substrate 18. The pattern 23 may comprise features 22 having a width $D_1$ and a spacing $D_2$. The length scale D is defined to be $D_1+D_2$. The length scale D commonly refers to the pitch of the smallest scale features 22 in the pattern 23. In half-pitch imaging, $D_1=D_2=D/2$.

An advantage of the near-field photolithographic system 10 is the ability to reproduce copies of the features 22 that are smaller than the diffraction-limited size W in Eq. (1). For example, the system 10 may substantially accurately reproduce images of features 22 having width $D_1$ wherein $D_1<W$. The width of the features may range from 10 nm to 1000 nm. The spacing between features may also range from 10 nm to 1000 nm. For example, in one embodiment of the photolithographic system 10, an array of 60-nm wide nanowires may be patterned on a D=120 nm pitch. Accordingly, the spacing between features may be 60 nm.

In some embodiments, the pattern 23 may comprise a periodic array of features 22 such as, for example, an array of wires, dots, circles, rings, triangles, or rectangles. The pattern 23 may be in the form of a grating. In other embodiments, the pattern 23 may comprise features 22 that are non-periodic or that are a combination of periodic and non-periodic components. The features 22 may be substantially parallel, as in a periodic array of nanowires, or they may intersect. The pattern 23 may comprise features 22 having a symmetry, such as linear, rectangular, or circular. The features 22 may be rounded, circular, triangular, rectangular, rectilinear, or may be irregular in shape. In various embodiments, the features 22 may correspond to shapes of different features formed in layers on a semiconductor wafer. A wide range of other shapes, configurations, arrangements, spacings and sizes are possible.

As shown in FIG. 2, the spacer layer is disposed on the substrate 18 and the features 22 thereon. After patterning the features 22 on the surface 29, for example, the superlens template 14 may be planarized by depositing the spacer layer 30 on the surface 29 of the substrate 18. The spacer layer 30 comprises a spacer material that is substantially transparent to light of the operating wavelength of the photolithographic system 10. It is advantageous for the spacer material to have good control of flow characteristics and physical stability. In addition, in certain embodiments, the spacer material has an index of refraction similar in value to that of the photoresist as discussed more fully below. The spacer material should have the ability to withstand the formation of the superlens 34, for example the deposition of material forming the superlens.

Spacer materials may generally comprise nonconductive materials. The electromagnetic properties of the spacer material may be characterized by a permittivity, $\in_d$. In general, the permittivity of a material is a complex number, which has a real part and an imaginary part. The permittivity of a medium generally depends on the wavelength of the light propagating through the medium. For convenience in the description provided herein, references to a value of a permittivity will be to the real part unless the imaginary part is explicitly stated for example by reference to the "complex permittivity." Dielectric materials have positive permittivities and may be suitable spacer materials. In one embodiment, the spacer material may be a polymer such as, for example, polymethyl methacrylate (PMMA) or parylene. Other materials such as quartz, glass, or $SiO_2$ may be used for the spacer layer 30. For reference, the permittivity of PMMA is approximately 2.4 at a wavelength of about 365 nm. Other materials and other permittivities may also be used.

In various preferred embodiments, the super lens 34 comprises a layer of material such as shown in FIG. 2. Moreover, in certain embodiments, the superlens 34 comprises a material that may support surface plasmon oscillations at a frequency corresponding to the operating wavelength λ of the light used in the photolithographic system 10. Surface plasmons are charge-density oscillations that propagate along a surface of the superlens 34. The amplitude of the oscillation decays exponentially in a direction transverse to the surface of the superlens 34. The interface between the superlens 34 and the spacer layer 30 will be capable of supporting surface plasmon oscillations if the permittivity of the spacer material is positive and the permittivity of the superlens material is negative. Accordingly, the superlens 34 comprises material that may be characterized by a negative permittivity, $\in_s$. At optical and ultraviolet frequencies, most metals have negative permittivities and may be suitable materials for the superlens 34. In certain embodiments, the imaginary part of the superlens permittivity is sufficiently small compared to the absolute value of the real part the permittivity so that the surface plasmon oscillations do not substantially dissipate their energy into heat.

In metals, the permittivity is negative for frequencies smaller than the plasma frequency of electrons in the metal's conduction band. Accordingly, in certain embodiments, the metal used for the superlens 34 is such that its plasma frequency exceeds the vacuum frequency of the light used in the system 10. In some embodiments, noble metals, such as, for example, silver or gold, may be suitable materials for the superlens 34, because the collective excitation of conduction electrons enables a surface plasmon oscillation at optical frequencies. In other embodiments, metals such as, for example, aluminum, copper, chromium, or tantalum, may be used as the superlens 34 material. Other materials may also be employed.

The superlens 34 is deposited on the spacer layer 30 by, for example, evaporation, sputtering, chemical deposition or using other techniques. The interface between the surface of the spacer layer 30 and the surface of the superlens 34 may be planarized to avoid surface roughness and corrugations that scatter surface plasmons and distort the imaging capabilities of the photolithographic system 10. In one embodiment, the root mean square surface roughness modulation may be below 1 nm for both the spacer layer 30 and the superlens 34. Smoother or rougher surfaces, however may also be used in different embodiments.

Figure 3:
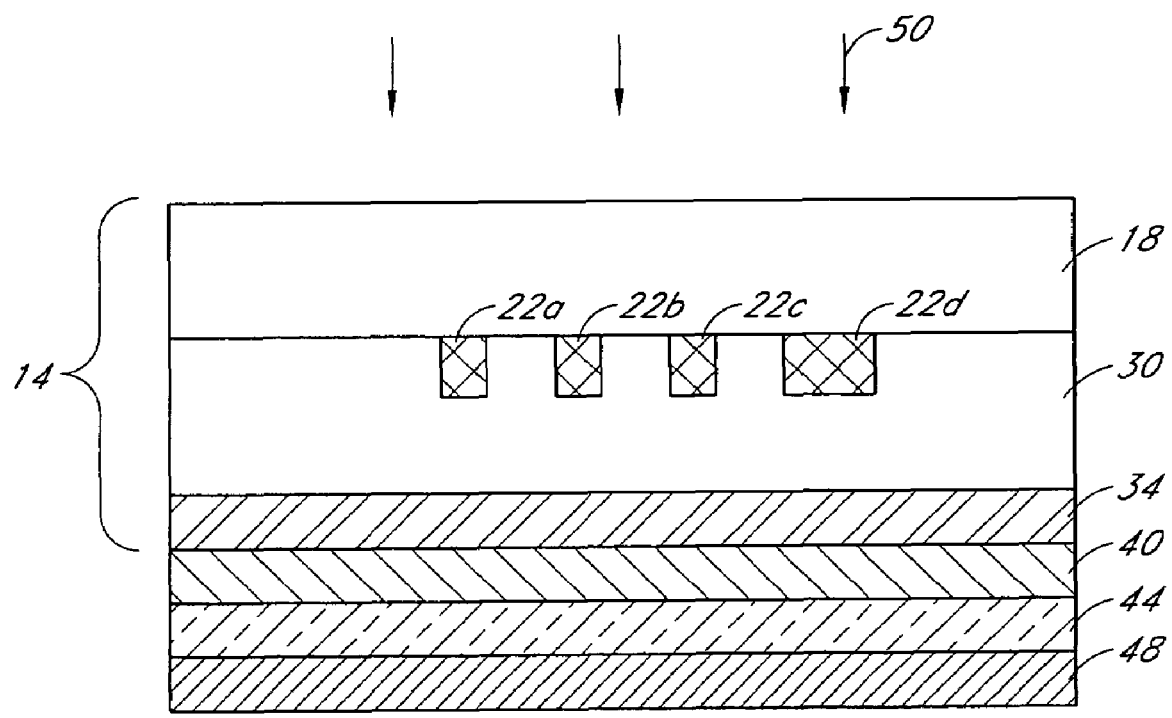
FIG. 3 is a cross-sectional view of an embodiment of a near-field photolithography system showing the superlens template disposed over a photosensitive material and having an intermediary layer therebetween.

FIG. 3 schematically illustrates further aspects of an embodiment of the photolithographic system 10. In the embodiment shown, the superlens template 14 is arranged to print images of the features 22 onto a photosensitive layer 44 disposed on a semiconductor wafer 48. Accordingly, the superlens template 14 is disposed over the semiconductor wafer 48 and in particular over the photosensitive layer 44 on the semiconductor wafer. An intermediary layer 40 is between the superlens template 14 and the semiconductor wafer. More particularly, the intermediary layer 40 is disposed between the superlens 34 and the photosensitive layer 44.

In various embodiments, the intermediary layer 40 comprises a material substantially optically transmissive to the light propagated through the superlens template 14. This material may be a fluid or a solid and may be a dielectric as discussed more fully below.

The photosensitive layer 44 may comprise photoresist that is sensitive to the operating wavelength propagated through the superlens template 14. Conventional semiconductor processing techniques may be used to spin the photoresist onto the semiconductor wafer 48. In one embodiment, a 120 nm thick layer of negative photoresist [NFR105G, Japan Synthetic Rubber Microelectronics (JSR Micro)] may be used. Other techniques both well known in the art as well as those yet to be discerned may be used to deposit and/or prepare the photosensitive material.

As shown in FIG. 3, light indicated by arrows 50, is incident on the template 14 and is substantially transmitted through the substrate 18. Light that is incident on one of the features 22 is substantially blocked, whereas light that is not incident on a feature 22 propagates through the spacer layer 30, which is substantially transmissive to the light. The light that propagates beyond the features 22 comprises both propagating waves that can reach the far-field and evanescent waves that are present only in the near-field. Evanescent waves do not diffract like optical waves in the far-field. Evanescent waves, for example, retain the size and shape of the features 22 more than waves in the far-field even if the features 22 are on the order of a wavelength or smaller. Accordingly, in various embodiments, optical energy from evanescent fields incident on the photosensitive material may have a size and shape similar to that of the features 22. Therefore, evanescent waves can be said to carry subwavelength information about the features 22. The near-field photolithography system 10 uses the evanescent fields to expose subwavelength portions of the photosensitive material thereby yielding subwavelength resolution patterning. In this respect, the near-field photolithography system 10 may capture information present in the evanescent waves and use this information for high resolution imaging and patterning.

Since the intensity of evanescent waves decays exponentially with increasing distance from the features 22, it may be difficult to resolve subwavelength features 22 if the photosensitive layer 44 is located at too great a distance from the features 22. For a line array with period D, the characteristic distance Z over which the intensity of the evanescent waves decays is $Z=(D/4\pi)/\sqrt{1-\epsilon_d(D^2/\lambda^2)}$, where $\epsilon_d$ is the permittivity of the spacer layer 30. As an example, the decay length in PMMA ($\epsilon_d \approx 2.4$) is 11 nm for 60 nm half-pitch features imaged at an operating wavelength of 365 nm. If the photosensitive layer 44 is located at too great a distance from the features 22, the subwavelength information carried by the evanescent waves may be lost, and only features having sizes larger than the diffraction limit in Eq. (1) may be imaged.

Without subscribing to any particular theory, the superlens 34 may enhance the intensity in the evanescent waves. Optical energy incident on a rearward surface of the superlens 34 may be coupled into plasmon modes, which are excited as a result of the incident light. Optical energy may be coupled out of a forward surface of the superlens 34 and may propagate to the photosensitive layer 44. The superlens 34 may provide enhanced energy throughput due to resonant excitation of surface plasmon oscillations. Resonant plasmon excitation occurs, for example, if the materials comprising the superlens 34 and the spacer layer 30 are selected to have permittivities that are substantially equal and of opposite sign, that is, $\epsilon_s \approx -\epsilon_d$. In embodiments of the photolithographic system 10 in which the spacer layer 30 and the superlens 34 comprise materials selected to satisfy this resonant condition, a broad range of plasmons may be excited by light transmitted by the spacer layer 30 and incident on the superlens 34. This effect is known as "superlensing." See, e.g., N. Fang, et al., "Sub-Diffraction-Limited Optical Imaging with a Silver Superlens," pp. 534-537, Science, Vol. 308, Apr. 22, 2005, which is herein incorporated by reference in its entirety. Accordingly, the materials comprising the superlens 34 and the spacer layer 30 may have permittivities that are substantially opposite in sign. These permittivities may also be substantially equal in magnitude. In these embodiments, subwavelength information carried by the evanescent waves can be used for sub-diffraction-limited imaging. In one embodiment, features 22 with sizes comparable to $\lambda/6$ may be resolved.

The thicknesses of the spacer layer 30 and the superlens 34 may be selected so that the template 14 provides superlensing. The thickness of the spacer layer 30 may be selected to be in the range 5 nm-200 nm. If the thickness of the spacer layer 30 is many times greater than the decay length of the evanescent waves, the throughput of the photolithographic system 10 may be reduced. In one embodiment, the spacer layer 30 may comprise a 40 nm layer of PMMA. Other thicknesses are also possible.

The thickness of the superlens 34 may be selected to be in the range of 5 nm-200 nm. Values outside this range may be possible in certain embodiments. The superlens effect, however, can be reduced if the thickness of the superlens 34 is too thick or too thin. Substantial enhancement of evanescent waves may occur if the superlens 34 is selected to have a thickness comparable to the half-pitch size of the features 22 to be imaged or to have a thickness that is a fraction of the operating wavelength, for example, $\lambda/10$. In one embodiment designed for imaging an array of 60 nm wires at 120 nm pitch, the superlens 34 may be a 35 nm layer of silver. If the superlens 34 is too thick, it may act as an attenuator of evanescent waves, rather than an amplifier, and the photolithographic system 10 may be able to resolve only features that are larger than the diffraction-limited size in Eq. (1). For example, in an embodiment of the photolithographic system 10 operating at 365 nm, a superlens 34 that is 120 nm thick may blur features 22 smaller than the diffraction limit. See, e.g., S. Durant, et al., "Comment on 'Submicron imaging with a planar silver lens'," p. 4403, Applied Physics Letters, Vol. 84, 2004, which is herein incorporated by reference in its entirety.

Conversely, in various embodiments, the features 22 comprise a material that does not possess plasmon resonances near the resonant frequency of the spacer layer 30 and superlens 34. Suitable materials for the features 22, for example, may have permittivities that are not substantially equal to the permittivity of the superlens material. In an example embodiment in which the superlens 34 is comprised of silver ($\epsilon_s \approx -$ 2.4 at 365 nm) and the spacer material 30 is comprised of PMMA ($\in_d \approx +2.4$), the features 22 advantageously may be comprised of chromium ($\in_{Cr} \approx -8.55$). The features 22 may comprise other materials as well.

The surface plasmons excited in the superlens 34 reradiate light that may be imaged by the photosensitive layer 44 deposited on the semiconductor wafer 48. As described above and schematically illustrated in FIG. 3, the intermediary layer 40 is interposed between the superlens template 14 and the photosensitive layer 40. In various embodiments, the intermediary layer 40 is substantially transmissive to light comprising wavelengths that are transmitted by the superlens 34. The intermediary layer 40 may also provide a level of protection for the layer of photosensitive material 44 from physical contact with the superlens template 14 and may also provide protection to the superlens 34 from contact with the photosensitive material 44.

As described above, the intermediary layer 40 may comprise a liquid or solid layer in certain embodiments. The intermediary layer 40 may comprise an organic material. Organic materials suitable for use in various embodiments include, for example, ethyl epoxy propionate (EEP), cyclohexanone, ethyl laurate (EL), propylene glycol monomethyl ether (PGME), or commercially available bottom anti-reflection coatings (BARCs). Additionally, other organic materials may be used. The organic material may comprise a liquid or a solid material in various embodiments. This organic layer may be chemically compatible with the photosensitive layer 44 such that the photosensitive material works effectively. To reduce internal reflections and to improve throughput, the intermediary layer 40 may fill the region between the superlens 34 and the photosensitive layer 44 so that there is no air gap between them. The refractive index of the intermediary layer 40 also may be similar in value to the refractive index of the material comprising the photosensitive layer 44 to reduce Fresnel reflection. By matching the refractive indices and eliminating air gaps, the intermediary layer 40 provides good optical coupling between the superlens 34 and the photosensitive layer 44 and improves the efficiency of the photolithographic system 10. Additionally, in certain embodiments, the intermediary layer 40 comprises material that is readily removable from the photosensitive layer 44. Organic coatings comprising some or all of these desired characteristics are available from many commercial manufacturers such as, for example, Clariant Corp. (Charlotte, N.C.), Brewer Science, Inc. (Rolla, Mo.), Sigma-Aldrich Co. (St. Louis, Mo.), Shipley Co. (Marlborough, Mass.), or Tokyo Ohka Kogyo Co., Ltd. (Kanagawa, Japan). Other materials may also be used.

Some embodiments of the photolithography system 10 may incorporate a superlens template 14 that comprises more than one superlens 34. In such embodiments, the superlenses 34 may be separated from each other by spacer layers 30, which may comprise the same or different dielectric materials. In one embodiment, one of the spacer layers 30 comprises a gain medium for the operating wavelength. The number, thickness, and separation of the superlenses 34 may be varied so as to reduce diffraction and to increase the resolution of the image of the features 22. For example, in some embodiments, a single 40 nm superlens may be replaced by two 20 nm superlenses or four 10 nm superlenses, each separated by layers of dielectric material such as PMMA. A variety of other arrangements and designs are possible.

Figure 4A:
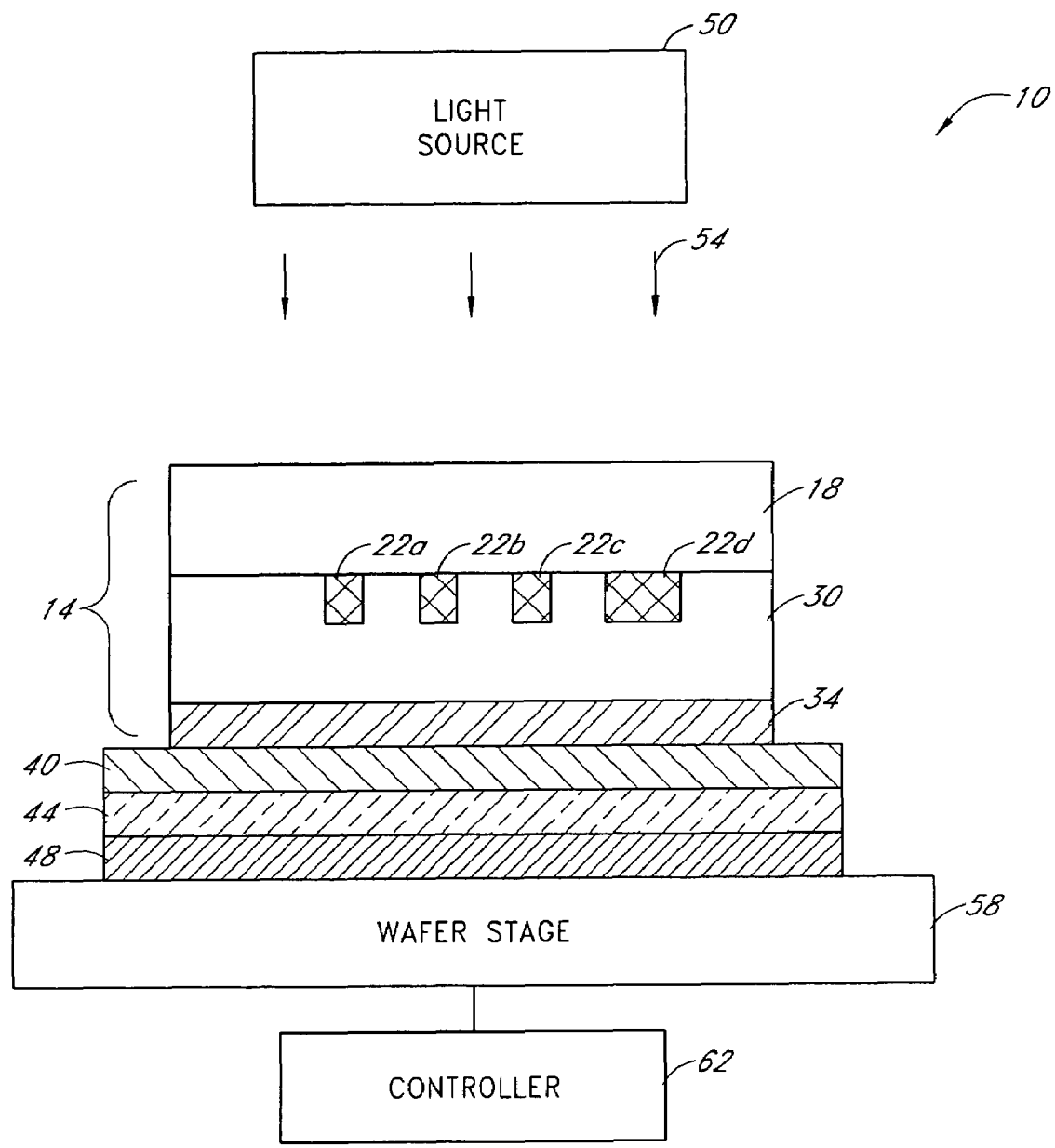
FIG. 4A is a schematic diagram of an embodiment of a near-field photolithography system wherein the intermediary layer comprises a coating on the photosensitive material.

FIG. 4A schematically illustrates one embodiment of the near-field photolithography system 10. A light source 50 provides light, represented by arrows 54, with operating wavelength $\lambda$ to form an image of the features 22 in the photosensitive layer 44 deposited on the semiconductor wafer 48. The operating wavelength of the light source 50 is selected to be suitable for exposing the photosensitive layer 44, which may be comprised of photoresist. The operating wavelength may, in general, range from about 100 nm to about 800 nm, extending from the extreme ultraviolet through the visible part of the electromagnetic spectrum. In some embodiments, infrared operating wavelengths may be used.

In certain embodiments, the photolithographic system 10 may use relatively inexpensive high pressure vapor lamps. Various preferred embodiments, for example, may use a high-pressure vapor light source 50 that emits light at operating wavelengths of about 365 nm or 580 nm. Alternatively, shorter wavelength light sources, such as, for example, excimer lasers, may be used. However, because the operating wavelength may comprise a visible wavelength, light sources that have higher efficiency and lower maintenance costs than excimer laser light sources may be used. Additionally, certain photoresists sensitive to visible wavelengths such as the mercury I-line are less expensive and more robust with respect to airborne contaminants than chemically amplified resists used in deep ultraviolet photolithography. Other types of light sources and operating wavelengths may be used as well.

The features 22 may be imaged by exposing the photosensitive layer 44 to light 54 of the operating wavelength for a predetermined exposure time and at a predetermined exposure flux. The exposure time and the exposure flux may depend upon the operating wavelength, the photosensitivity of the layer 44, the size of the features 22, and the throughput of the superlens template 14. The photosensitive layer 44 may be developed and etched using conventional semiconductor wafer processing techniques. In one embodiment, the template 14 may be flood-exposed to light 54 having a 365 nm operating wavelength at a flux of 8 mW/cm$^2$ for a time of 60 seconds. Other operating wavelengths, exposure fluxes, and exposure times may be used in other embodiments of the system 10. For example, the exposure time may range from seconds to minutes depending on the exposure flux.

The light 54 is incident on the template 14 so as to produce sub-diffraction-limited images as described herein. For example, in one embodiment, features 22 with widths $D_1$ as small as $\lambda/6$ may be accurately reproduced without enlargement or blurring. As shown in the embodiment shown in FIG. 4A, the light source 50 is disposed directly above the superlens template 14; however, other configurations may be suitable. For example, the light source 50 may be disposed to one side of the system 10 and one or more mirrors, prisms, lenses or other optical elements may be used to direct the light 54 onto the template 14. Other configurations of the light source 50 are also possible.

The semiconductor wafer 48 is supported by a wafer stage 58, which may be configured to position the wafer 48. A controller 62 may be used to control the vertical and lateral positioning of the wafer stage 58 with respect to the superlens template 14. The wafer stage 58 in FIG. 4A may be configured to translate in both horizontal directions and/or the vertical direction. For example, the wafer stage 58 may be adjusted so that the photosensitive layer 44 on the semiconductor wafer 48 is in the near field of the superlens template 14. The controller 62 may optionally utilize a feedback system (not shown) to assist in positioning the wafer stage 58 and in maintaining the photosensitive layer 44 in the near-field of the superlens 34. The controller 62 may comprise a computer, computer network, one or more microprocessors, or any electronics or apparatus suitable for controlling the wafer stage 58. Servomotors, stepper motors, or piezoelectric-driven devices may be used to move and position the wafer stage 58. In some embodiments, the template 14 may be smaller than the wafer 48, as shown in FIG. 4A, while in others the template 14 may be of equal or greater size. Accordingly, embodiments of the photolithographic system 10 may be configured for full-wafer printing, stepping, scanning, or other arrangements.

The superlens template 14 may be supported with respect to the semiconductor wafer 48 by a support (not shown). The template support may be fixed or it may be movable. The controller 62 or a separate template controller (not shown) may be used to control the movement and positioning of the superlens template 14. In some embodiments, the wafer stage 58 may be fixed and the template support may be configured to move the superlens template 14 with respect to the wafer stage 58. The template support may for example be adjusted so that the photosensitive layer 44 on the semiconductor wafer 48 is in the near field of the superlens template 14. FIG. 4A shows an embodiment of the photolithographic system 10 wherein the superlens template 14 is positioned above the semiconductor wafer 48. In other embodiments, the relative positions of these components may be different. For example, in one embodiment the semiconductor wafer 48 may be secured to the wafer stage 58 and disposed above the superlens template 14.

Other configurations are also possible. For example, the photolithographic system 10 may be configured differently and may include additional components. The order and arrangement of the components may be different and some of the components may be removed. The individual components themselves may be different. For example, a wide array of light sources 50, wafer stages 58, and controllers 62 may be used. The photolithographic system 10 may be configured to use a wide variety of semiconductor wafers 48 and photosensitive layers 44. The superlens template 14 may be arranged and configured differently than illustrated in FIG. 4A.

In one embodiment illustrated in FIG. 4A, the intermediary layer 40 may comprise an organic coating deposited on the photosensitive layer 44. The organic coating may comprise a liquid or solid coating in some embodiments. However, the coating need not be organic. The use of a coating, such as an organic coating, as an intermediary layer 40 obviates the need for an adhesion-release layer in the photolithographic system 10, because the photosensitive layer 44 never makes contact with the superlens template 14.

In various embodiments, the intermediary layer 40 mediates the positioning of the photosensitive layer 44 with respect to the superlens template 14. For example, as is well known in the art, current leveling technology may be used to provide a substantially constant vertical separation between the superlens 34 and the photosensitive layer 44. The intermediary layer 40 may provide a tolerance for placement of the template 14 with respect to the photosensitive material 44 as the wafer stage 58 and the template are brought together. The intermediary layer 40 may also provide cushioning and may prevent damage as the photosensitive layer 44 is brought into near-field proximity to the superlens 34. As described herein, the intermediary layer 40 may provide good optical coupling between the superlens 34 and the photosensitive layer 44 so as to increase the efficiency and throughput of the photolithographic system 10.

The thickness of the intermediary layer 40 should be sufficiently thin so that the photosensitive layer 44 is within the near-field of the superlens 34. In some embodiments, the thickness of the intermediary coating 40 may be in the range of 5 nm-1000 nm. Alternatively, the thickness of the intermediary layer 40 may be selected to be comparable in value to that of the spacer layer 30 or the superlens 34. For example, in one embodiment, the intermediary coating 40 may be about 40 nm in thickness. In other embodiments, the thickness of the intermediary coating 40 may be in the range from 5 nm to 200 nm. The coating 40 may be thicker or thinner in different embodiments. It may be beneficial for the coating to be easily removable from the photoresist 44. In certain embodiments, for example, the coating may be washed off or may be removed by stripping with chemical solvents or rinse agents. Other techniques for removing the coating may also be employed.

In some embodiments, the intermediary coating comprises a plurality of layers. These layers may have similar properties as described above with respect to the coating 40 shown in FIG. 4A. For example, the layers may have similar refractive indices to reduce reflections. In some embodiments, the different layers may have different properties. For example, one of the layers may provide easy release from the photosensitive material. Other configurations are also possible.

Figure 4B:
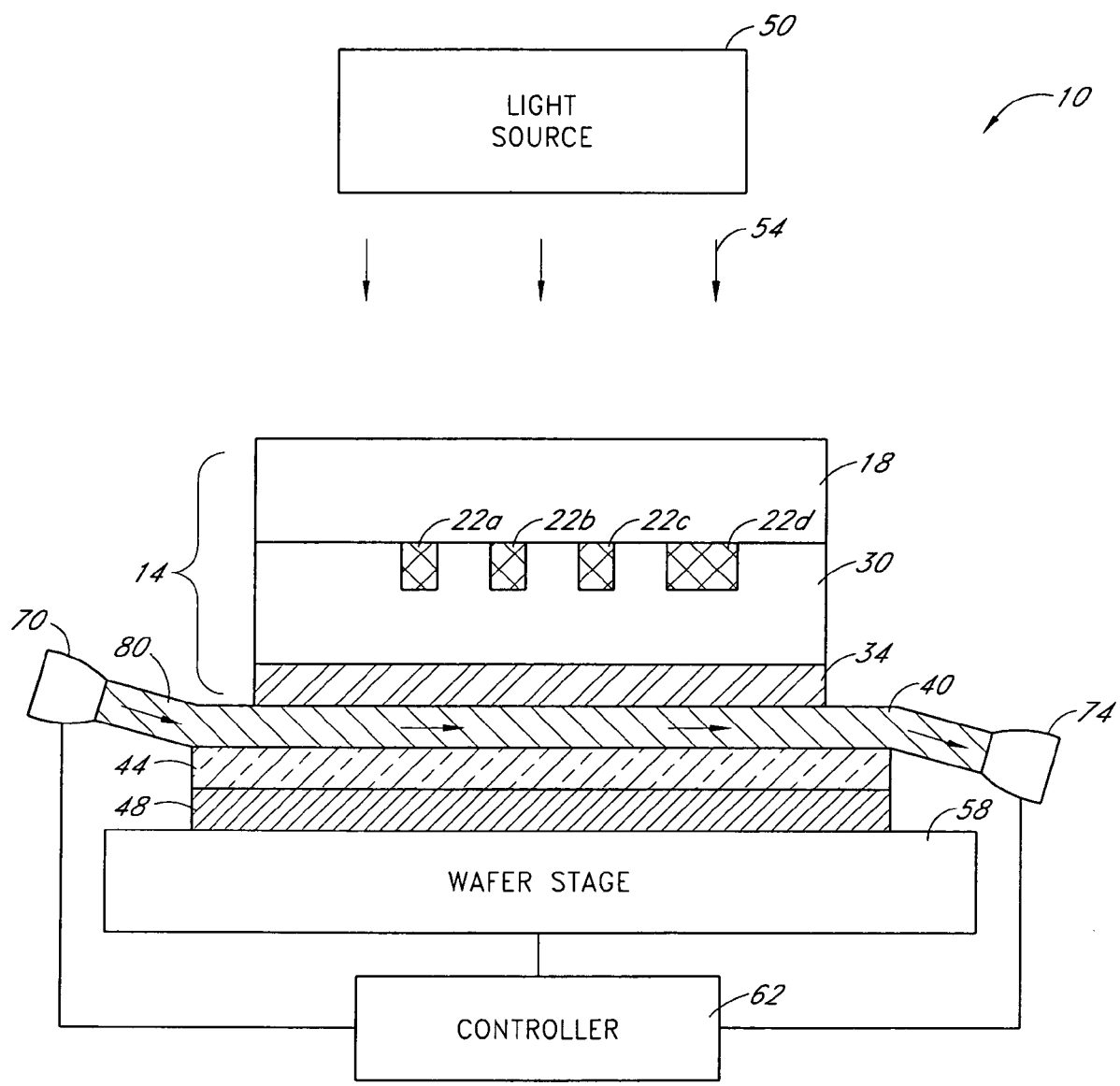
FIG. 4B is a schematic diagram of an embodiment of a near-field photolithography system using a flowing fluid as the intermediary layer.

FIG. 4B illustrates an embodiment of the photolithography system 10 wherein a liquid flow mechanism may be used to provide the intermediary layer 40. Many of the components in illustrated in FIG. 4B are generally similar in form or function to those illustrated in FIG. 4A and will not be further discussed except in regard to their differences.

In the embodiment illustrated in FIG. 4B, the intermediary layer 40 is formed by injecting a liquid 80 from an injection nozzle 70 such that the liquid 80 flows between the superlens template 14 and the photoresist-coated semiconductor wafer 48. The liquid 80 is removed by an intake nozzle 74. The intake nozzle 74 may use suction to remove the liquid 80. Although two nozzles 70 and 74 are illustrated in FIG. 4B, other embodiments may use one or more nozzles for both injection and intake. In other embodiments, the intake nozzle 74 may be replaced by one or more drains (not shown) to remove the liquid 80 form the system 10. The controller 62 may control the positioning of the wafer stage 58 in substantially the same manner as described in FIG. 4A. Optionally, the controller 62 may control the rate at which the liquid 80 is injected into and removed from the system 10 through the nozzles 70 and 74. A separate nozzle controller (not shown) may be used in some embodiments.

The liquid 80 may be stored in a reservoir (not shown) prior to injection into the system 10 through the injection nozzle 70. In some embodiments, surface tension of the liquid 80 may provide the physical mechanism through which the liquid spreads in the region between the superlens 34 and the photosensitive layer 44. An array of injection nozzles 70 may also surround the semiconductor wafer 58 to provide a flow of the liquid 80. In some embodiments, the liquid 80 removed by the intake nozzle 74 is recirculated within the system 10, whereas in other embodiments, the removed liquid 80 is discarded from the system 10. One or more pumps (not shown) may be used to inject the liquid 80 into the system 10. In some embodiments, the controller 62 may control the pumps so as to control the rate of flow of the liquid 80 between the superlens template 14 and the semiconductor wafer 48.

The liquid 80 may be used to mediate the transfer of light from the superlens 34 to the photosensitive layer 44. Accordingly, the liquid 80 may have a refractive index that is similar to the refractive index of the material selected for the photosensitive layer 44, e.g., photoresist to reduce reflection. Additionally, the liquid 80 may be chemically compatible with the photosensitive layer 44, be of substantially uniform density, and be non-contaminating. The liquid 80 may be substantially transmissive to light of the wavelengths transmitted by the superlens 34 so as to provide sufficient optical throughput of the photolithographic system 10. To prevent spurious reflections, the liquid 80 advantageously may fill the region between the superlens 34 and the photosensitive layer 44 so that there are no air gaps.

The liquid 80 may comprise, for example, water, and in particular, purified and de-gassed water. In other embodiments, the liquid 80 may comprise supercritical carbon dioxide or choline chloride. Other liquids may also be used. The liquid 80 may be selected such that its properties, such as, for example, viscosity, density, transparency, refractive index, surface tension, thermal conductivity, or thermal compressibility, are suitable.

A liquid flow system 10 as illustrated in FIG. 4B may be susceptible to the formation of bubbles in the liquid 80, especially in cavitation-prone regions near moving surfaces. Bubbles may result in image obstructions, aberrations, and anomalies due to light absorption, reflection, or scattering. Accordingly, it is desirable to reduce the incidence of bubble formation in the photolithographic system 10. Optionally, some embodiments may utilize a temperature control system (not shown) and/or a filtration system (not shown) to control the properties of the liquid 80 so as to improve, e.g., the imaging capabilities of the photolithographic system 10.

The liquid flow embodiment illustrated in FIG. 4B is commonly known in the art as a "shower" configuration for immersion photolithographic systems. Other embodiments of the photolithographic system 10 may utilize alternative configurations, such as, for example, a "bathtub" or "swimming pool" configuration in which all or some of the system 10 is immersed or submerged in the liquid 80. In certain embodiments of the photolithographic system 10, the intermediary layer 40 may comprise a coating on the photosensitive material 44 and a liquid flow mechanism.

The systems and methods described herein advantageously enable the patterning of semiconductor wafers 48. A photosensitive layer 44 comprising photoresist can be exposed, and images of the pattern 23 may be printed on the semiconductor wafer 48. The photolithographic system 10 may be used to pattern metal, semiconductor, and insulating layers and to control doping or alloying of portions of such layers as is well known in the art. The systems and methods can be used in a wide range of other semiconductor device fabrication applications as well. Although the system and methods described herein have been discussed with regards to photolithographically patterning the semiconductor wafer 48, the systems and methods may be used in other applications, for example, to pattern other types of samples or products. Other types of applications are possible, as well.

Advantageously, high-resolution, sub-diffraction-limited photolithographic imaging may be provided by the present systems and methods. However, the systems and methods may be applicable to low-resolution patterning as well. The photolithographic system 10 may also be used with other types of plasmonic lenses. An advantage of the systems and methods described herein is their simplicity of use in the commercial fabrication of semiconductor devices.

Various embodiments of the invention have been described above. Although this invention has been described with references to these specific embodiments, the descriptions are intended to be illustrative of the invention and are not intended to be limiting. Various modifications and applications may occur to those skilled in the art without departing from the true spirit and scope of the invention as defined in the appended claims.

What is claimed is:

1. A photolithographic system for exposing a photosensitive material having a first index of refraction and responsive to light having a wavelength, $\lambda$, said system comprising:

a plurality of features that are opaque to said light;

a dielectric material disposed forward of said plurality of opaque features, said dielectric material being substantially transmissive to said light;

a superlens disposed forward of said dielectric material and rearward of said photosensitive material; and an intermediary layer between said superlens and said photosensitive material, the intermediary layer comprising material substantially transmissive to said light, said material being different than said photosensitive material, the intermediary layer not permanently in contact with said superlens.

2. The photolithographic system of claim 1, wherein said photosensitive material comprises photoresist.

3. The photolithographic system of claim 1, wherein said light comprises visible or ultraviolet light.

4. The photolithographic system of claim 1, wherein said plurality of features comprises metal.

5. The photolithographic system of claim 4, wherein said metal comprises chromium.

6. The photolithographic system of claim 1, wherein the features have a width that is smaller than the wavelength, $\lambda$, and adjacent features are spaced apart by a distance smaller than the wavelength, $\lambda$.

7. The photolithographic system of claim 6, wherein the width and spacing are about $\lambda/6$ or less.

8. The photolithographic system of claim 1, wherein said plurality of features is formed on a substrate that is transparent to said light.

9. The photolithographic system of claim 8, wherein said plurality of features are forward of said substrate.

10. The photolithographic system of claim 1, wherein said dielectric material comprises polymethyl methacrylate.

11. The photolithographic system of claim 1, wherein said dielectric material has a thickness less than about 100 nanometers.

12. The photolithographic system of claim 1, wherein said superlens comprises metal.

13. The photolithographic system of claim 12, wherein said metal comprises silver, gold or platinum.

14. The photolithographic system of claim 1, wherein said superlens has a surface closest to said plurality of opaque features that is in the near field of said plurality of opaque features.

15. The photolithographic system of claim 14, wherein said surface is separated from said plurality of opaque features by a distance of less than about 100 nanometers.

16. The photolithographic system of claim 1, wherein said photosensitive material has a surface closest to said superlens that is in the near field of said superlens.

17. The photolithographic system of claim 16, wherein said photosensitive material is separated from said superlens by a distance of less than about 100 nanometers.

18. The photolithographic system of claim 1, wherein said intermediary layer has sufficient thickness to protect the photosensitive material from damage from contact with the superlens.

19. The photolithographic system of claim 18, wherein said intermediary layer is non-permanent such that the superlens can be separated from the intermediary layer without damaging the photosensitive material.

20. The photolithographic system of claim 18, wherein said intermediary layer has a thickness less than about 100 nanometers.

21. The photolithographic system of claim 18, wherein said intermediary layer comprises organic material.

22. The photolithographic system of claim 1, wherein said intermediary layer comprises a material having a second index of refraction that is substantially equal to said first index of refraction of said photosensitive material.

23. The photolithographic system of claim 1, wherein a near-field image of said plurality of features is produced in said photosensitive material.

24. The photolithographic system of claim 1, wherein said superlens comprises a first superlens and a second superlens, wherein said second superlens is disposed forward of said first superlens and rearward of said photosensitive material.

25. The photolithographic system of claim 24, wherein said dielectric material comprises a first dielectric material and a second dielectric material, wherein said second dielectric material is disposed forward of said first superlens and rearward of said second superlens.

26. The photolithographic system of claim 1, wherein said intermediary layer comprises a solid.

27. The photolithographic system of claim 1, wherein said intermediary layer comprises a liquid.

28. The photolithographic system of claim 27, further comprising a liquid flow system configured to provide said intermediary layer.

29. The photolithographic system of claim 28, wherein said liquid flow system is configured to inject said liquid between said photosensitive material and said superlens.

30. The photolithographic system of claim 27, wherein said liquid comprises water.

31. The photolithographic system of claim 1, wherein said intermediary layer is in contact with said photosensitive material.

32. The photolithographic system of claim 1, wherein said superlens and said photosensitive material define a region therebetween, and said region is filled by said intermediary layer without air gaps.

33. The photolithographic system of claim 1, wherein said intermediary layer comprises a coating on said photosensitive material.

34. The photolithographic system of claim 33, wherein said coating comprises an organic material.

35. The photolithographic system of claim 1, wherein said intermediary layer is removable from said photosensitive material.

36. The photolithographic system of claim 35, wherein said intermediary layer is removable by a rinse agent.

* * * * *